(12) United States Patent
Vergauwen et al.

(10) Patent No.: US 11,287,455 B2
(45) Date of Patent: Mar. 29, 2022

(54) SENSOR INTERFACE CIRCUIT

(71) Applicant: Melexis Technologies NV, Tessenderlo (BE)

(72) Inventors: Johan Vergauwen, Kruibeke (BE); Peter Vandersteegen, Deurne (BE); Asparuh Ivanov Grigorov, Sofia (BG)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 228 days.

(21) Appl. No.: 16/671,357

(22) Filed: Nov. 1, 2019

(65) Prior Publication Data

US 2020/0141984 A1 May 7, 2020

(30) Foreign Application Priority Data

Nov. 5, 2018 (EP) .................................. 18204290

(51) Int. Cl.
| | |
|---|---|
| *G01R 31/28* | (2006.01) |
| *G01R 19/252* | (2006.01) |
| *G01D 3/02* | (2006.01) |
| *G01D 3/036* | (2006.01) |
| *G01D 18/00* | (2006.01) |
| *G01R 31/317* | (2006.01) |
| *H03M 1/12* | (2006.01) |

(52) U.S. Cl.
CPC ........... *G01R 19/252* (2013.01); *G01D 3/022* (2013.01); *G01D 3/036* (2013.01); *G01D 18/008* (2013.01); *G01R 31/2829* (2013.01); *G01R 31/317* (2013.01); *H03M 1/1205* (2013.01)

(58) Field of Classification Search
CPC ............. G01R 19/252; G01R 31/2829; G01R 31/317; G01D 3/022; G01D 3/036; G01D 18/008; H03M 1/1205
See application file for complete search history.

(56) References Cited

U.S. PATENT DOCUMENTS

| | | |
|---|---|---|
| 6,396,398 B1 | 5/2002 | Donat et al. |
| 9,638,762 B2 | 5/2017 | Scherr |
| 9,863,786 B2 | 1/2018 | Reidl et al. |
| 2004/0075447 A1 | 4/2004 | Corkum et al. |
| 2005/0033540 A1 | 2/2005 | Bathurst et al. |
| 2007/0185673 A1 | 8/2007 | Hubanks et al. |
| 2009/0177056 A1 | 7/2009 | Say et al. |

(Continued)

OTHER PUBLICATIONS

European Search Report from EP Application No. EP18204290, dated Mar. 28, 2019.

*Primary Examiner* — Mohamed Charioui
*Assistant Examiner* — Christine Y Liao
(74) *Attorney, Agent, or Firm* — Workman Nydegger

(57) ABSTRACT

A sensor interface circuit comprises an input arranged to receive a sensor signal being an electrical signal representative of an electrical quantity. The electrical quantity includes a physical quantity converted in a sensor. The sensor interface circuit includes conversion means arranged for converting the sensor signal into a digital signal, memory to store sensor characterisation data, signal processing means adapted to obtain a first sensor result by processing the digital signal using the sensor characterisation data, and an output unit arranged to receive and output the first sensor result, the digital signal and the sensor characterisation data.

14 Claims, 3 Drawing Sheets

(56) References Cited

U.S. PATENT DOCUMENTS

| | | | |
|---|---|---|---|
| 2012/0074972 A1* | 3/2012 | Rasornig | G01D 3/08 324/750.3 |
| 2013/0200909 A1 | 8/2013 | Rasornig et al. | |
| 2018/0203059 A1* | 7/2018 | Sacco | G01R 31/2856 |
| 2018/0266856 A1 | 9/2018 | Broadley et al. | |

* cited by examiner

Physical property = $A_0 + A_1(T-T_0) + A_2(T-T_0)^2 +$
$\{B_0 + B_1(T-T_0) + B_2(T-T_0)^2\}(\Delta-\Delta_0) +$
$\{C_0 + C_1(T-T_0) + C_2(T-T_0)^2\}(\Delta-\Delta_0)^2$

SENSOR INTERFACE CIRCUIT

FIELD OF THE INVENTION

The present invention is generally related to the field of sensor interfaces for sensor systems.

BACKGROUND OF THE INVENTION

Sensors are increasingly important in any field where finer and ever more intelligent control is needed. Examples are found in the growing fields of automotive applications or wireless sensor networks (WSN). In the automotive industry sensors are essential for applications ranging from increased safety to road stability as well as to improve car performance and reliability demanded by customers. Further, compact and low-power sensor interfaces are needed to be competitive on the growing market and to enable new applications for the 'Internet of things'.

Although the market asks for additional functionality, the price pressure remains. The silicon area is a main contributor to the cost of the sensor interface; therefore, the interface has to be made as small as possible. This should not only be valid for the technology nodes that are used today (and which are still relatively big for the automotive industry), but also in more advanced technologies.

An important product feature of today's sensors in an automotive application is functional safety. A wrong readout by a sensor can put the driver and his/her surroundings in danger. As such, the sensor's signal should either be correct or flagged as wrong. The system either trusts the signal or discards the signal. A popular, but expensive way to diagnose a sensor's health is by comparing the signal of multiple sensors. In addition, decomposing one readout by multiple non-identical sensors can improve safety. Using non-identical sensors can be crucial as common mode failures cannot always be detected. Consider, for example, two cameras in a foggy situation. Their readout is less trustworthy than one camera and radar.

In U.S. Pat. No. 9,638,762IC sensor diagnostics using multiple (e.g., redundant) communication signal paths are presented, wherein one or more of the communication signal paths can be diverse (e.g., in hardware, software or processing, in operating principle or in some other way) from at least one other of the multiple communication signal paths.

U.S. Pat. No. 9,863,786 discloses a solution where the different paths use different data representations. The sensor elements can operate to communicate respective signal components having different data representations, such as different trigonometric representations, inverse representations with respect to one another, different addends of a sum or other different proportional or inverse proportional representations with respect to one another.

Application US2013/200909 relates to a fully integrated sensor device where two separate signal paths enable functional safety. A crucial aspect about this integrated device is that the sense element is part of the integrated circuit.

US2004/075447 is concerned with a low-cost sensor interface IC with two identical signal paths. The sense element is a pressure sensitive membrane with four piezo resistive components. Most designs use a full bridge where all four piezo resistances enable one readout signal path. This design uses two half bridges, where two out of four piezo-resistances enable one readout and the other two out of four piezo resistances enable the other readout. Although functional safety is increased, a common mode failure reduces the functional safety rating.

In the approach of U.S. Pat. No. 6,396,398 there are two 'sensor information or evaluation devices' on different sides of the data transmission unit. Singular further processing is permitted for the safe evaluation of sensor signals by producing a redundancy signal in accordance with a prescribed algorithm when the sensor signals are actually generated. The redundant single-channel nature is made possible by virtue of safety-conforming data processing and data transmission being carried out on a single channel by virtue of a downstream processing device deriving dual-channel signals therefrom, by reversing the algorithm and testing them for plausibility by reciprocal result comparison. Hence, the external processing unit calculates the signal to compare with by reversing the prescribed processing instructions. So, a raw signal is calculated from the compensated signal and compared with the raw signal used at the start.

There is, however, room for alternative solutions to safely evaluate sensor signals that do not rely on the use of multiple sensors.

SUMMARY OF THE INVENTION

It is an object of embodiments of the present invention to provide for a cost efficient sensor interface circuit for functional safety.

The above objective is accomplished by the solution according to the present invention.

In a first aspect the invention relates to a sensor interface circuit comprising
- an input arranged to receive a sensor signal being an electrical signal representative of an electrical quantity, said electrical quantity being a physical quantity converted in a sensor,
- conversion means arranged for converting said sensor signal into a digital signal, memory to store sensor characterisation data,
- signal processing means adapted to obtain a first sensor result by processing said digital signal using said sensor characterisation data,
- an output unit arranged to receive and output said first sensor result, said digital signal and said sensor characterisation data.

The proposed sensor interface circuit indeed allows for use in safety critical applications. One sensor result is calculated in the sensor interface circuit and next output to a further device of the application along with the digital signal derived from the sensor signal and with the sensor characterisation data. The sensor interface circuit so provides that further device with all required information to determine a second sensor result using different processing means than the processing means used in the sensor interface circuit to obtain said first sensor result. The further device can then compare the first and the second sensor result and so verify their reliability.

In a preferred embodiment said output unit is connectable to a communication bus. Advantageously the communication bus is bidirectional.

In embodiments of the invention the output unit is arranged for time multiplexing the first sensor result, the digitized version of the sensor signal and the sensor characterisation data.

In a preferred embodiment the conversion means comprises a filter and/or an amplifier.

In some embodiments the sensor interface circuit comprises separate conversion means for a first signal path comprising the processing means and for a second signal path guiding the digital signal to the output unit. Advantageously the input is arranged to receive two sensor signals from the sensor, whereby each sensor signal is applied to a different one of said separate conversion means.

In another embodiment the input is arranged to receive an additional sensor signal from an additional sensor. In such case there are for example two sensor signals, each coming from a different sensor, and each applied to a different conversion means.

In another embodiment the sensor interface circuit may comprise a further memory to store separately the sensor characterisation data to be output by the output unit.

Advantageously, the sensor interface circuit comprises a sensor arranged to convert the physical quantity into the electrical quantity and to output the sensor signal.

In advantageous embodiments the sensor interface circuit is arranged to derive temperature information and to output that temperature information.

In another aspect the invention relates to a method for verifying signals derived from a sensor signal received in a sensor interface circuit as previously described. The method comprises:
  receiving the sensor signal in said sensor interface circuit,
  determining a first sensor result in the signal processing means of the sensor interface circuit by processing the digital signal using the sensor characterisation data,
  outputting from the sensor interface circuit the first sensor result, the digital signal and the sensor characterisation data to an external control unit,
  determining in the external control unit a second sensor result by processing the digital signal using the sensor characterisation data in a signal processing means of the external control unit,
  comparing the first and the second sensor result.

In one embodiment the method further comprises a step of which of the first and second sensor result is most trustworthy. The most trustworthy sensor result may be determined by exploiting at least one additional signal path.

In embodiments the external control unit sends a request to receive the sensor characterisation data to the sensor interface circuit.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
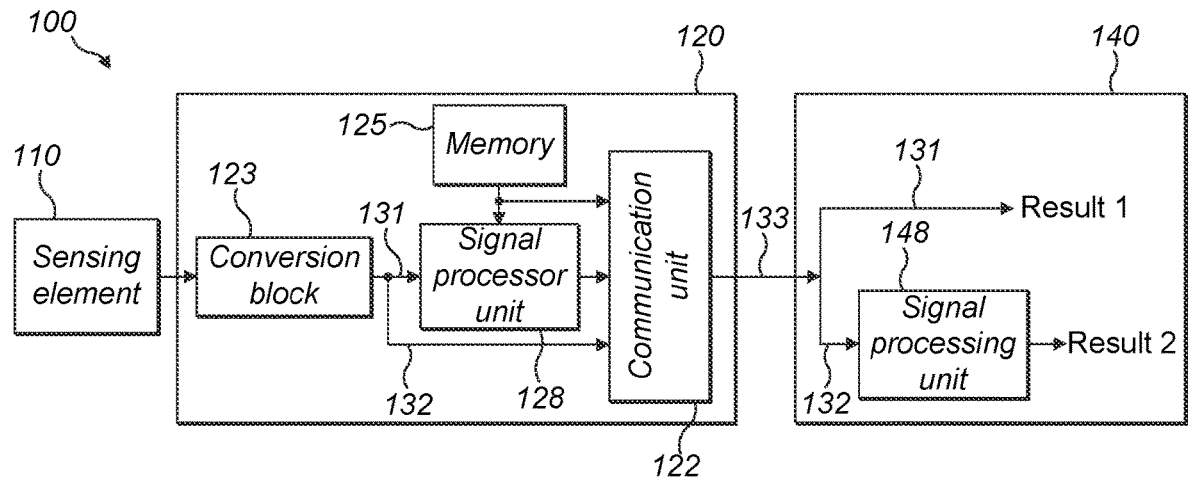
FIG. 1 illustrates a block scheme of an embodiment of the sensor interface circuit of the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

A sensor converts a physical quantity into an analog electrical quantity. Typically, the sensor output signal is too small to be used directly. Therefore, a sensor interface circuit amplifies the signal comprising the electrical quantity received from the sensor to obtain a more useful signal. The signal is often also further processed (e.g. filtered) in the sensor interface. Additionally, the signal is converted to a digital signal and further processed in the digital domain. In the context of the present invention a sensor interface circuit is considered to be a structure to transfer the electrical quantity coming out of the sensor into a digital signal. Although the input signal containing the physical quantity to be converted in the sensor often represents a pressure, temperature or magnetic field, also other types of physical signals can be used as input to the interface circuit of this invention.

Although it may be advantageous in many embodiments of the sensor interface circuit of the invention to have the sensor as a part of the interface circuit, this is not strictly required. In other embodiments the sensor(s) may be external to the circuit of the invention and the circuit is fed with an electrical signal representative of the electrical quantity into which the physical quantity is converted in the sensor.

The present invention discloses a sensor interface circuit comprising one signal path where a first sensor result is calculated. The resulting signal and the information required to perform a second calculation is then outputted. This second calculation is performed outside the sensor interface circuit. As also the outcome of the first calculation is outputted to a further device of the application, the latter is capable of comparing the two results.

The sensor interface circuit of this invention is typically used in safety critical applications. The sensor interface circuit receives from the sensing element the analog electrical signal to which the physical quantity was converted. The analog signal is fed to a conversion block of the sensor interface circuit and outputs a digitized version of that electrical signal, which is subsequently employed by another device in the application, e.g. in an Engine Control Unit (ECU). As already mentioned, the sensor element itself does not have to be part of the sensor interface's integrated circuit, but the signal output by the sensor is applied to the sensor interface. For the application to use the sensor output, the characterization information of the sensor is needed.

One example of such a sensor is a membrane for pressure sensor readout. The resistances of the piezo-resistive bridge on this membrane change according to the pressure sensed by the membrane. Each resistance is also affected by the process variations. In embodiments of the invention the sensor element is distinct from the interface, but the bridge nodes are connected to the interface. The safety critical application can be e.g. the electronic stability control system of a car, i.e. the interface is connected to an ECU of the vehicle.

In the proposed solution the sensor characterisation data, e.g. in the form of calibration coefficients, is stored in the sensor interface circuit. This data is used in the first signal path to calculate the first signal result. The sensor characterisation data is transferred to another device used in the application, e.g. an engine control unit. These correction coefficients are subsequently used to process the digital signal in the second signal path outside the sensor interface circuit. The digital protocol applied to transfer data from the sensor interface to the ECU can transmit these coefficients during initialization of the device. Also, after initialization these coefficients can be sent regularly at a slow pace. Furthermore, also temperature information (or any other parameter that has an influence on the sensor output) may be sent. This should not be sent only during initialization, but at regular time instants. Typically, this can also be done at a slow pace, because temperature does not change so quickly.

Providing redundancy is a common way to improve functional safety. Comparing the results out of two redundant signal paths identifies whether the signal is correct. Common mode errors are to be avoided. So, some differences in the signal paths are to be introduced. With common mode errors is meant that the same mistake is made in both signal paths (for example, a disturbance affecting both signal paths in the same way). So, it is important is to make the two signal paths sufficiently different.

One way to achieve this is illustrated in FIG. 1. The sensor system 100 in FIG. 1 comprises a sense element 110, a sensor interface circuit 120 and an ECU 140. While the resulting signal in one of the two signal paths 131, 132 is calculated in the sensor interface 120, the calculation of the other is performed in a separate unit 140 (in the ECU in this example). So, the sensor interface 120 fully calculates signal Result 1, whereas signal Result 2 is calculated at least partially in the ECU. This requires a signal processor unit 128 like e.g. a digital signal processor (DSP) or a microcontroller in the sensor interface to perform the calculations for the first signal result and a signal processing unit 148 in or connected with unit 140 to perform the calculations for the second signal result. The signal processor units can be similar or have different implementations.

Since the sensor element signal is an analogue signal, it requires a conversion block 123. The conversion block comprises at least a conversion means to digitize the analogue signal, like an Analogue-to-Digital Converter (ADC), a time-to-digital converter or a sensor-to-digital converter. However, also filtering means and/or amplification means can be provided in the conversion block. The signal obtained at the output of the conversion block is a digital signal.

The digital signal is used for the calculations in the DSP block 128 of the sensor interface circuit. The DSP 128 is operably connected with the memory 125 where the calibration coefficients are stored, so that the DSP can obtain the coefficients needed for the calculations. DSP 128 is further operably connected to a communication unit 122. This communication unit is via a communication bus 133 connected with the ECU 140. The bus is used for transferring the calculated result for the first signal path (Signal result1) as well as the input for performing the second calculation.

Figure 2:
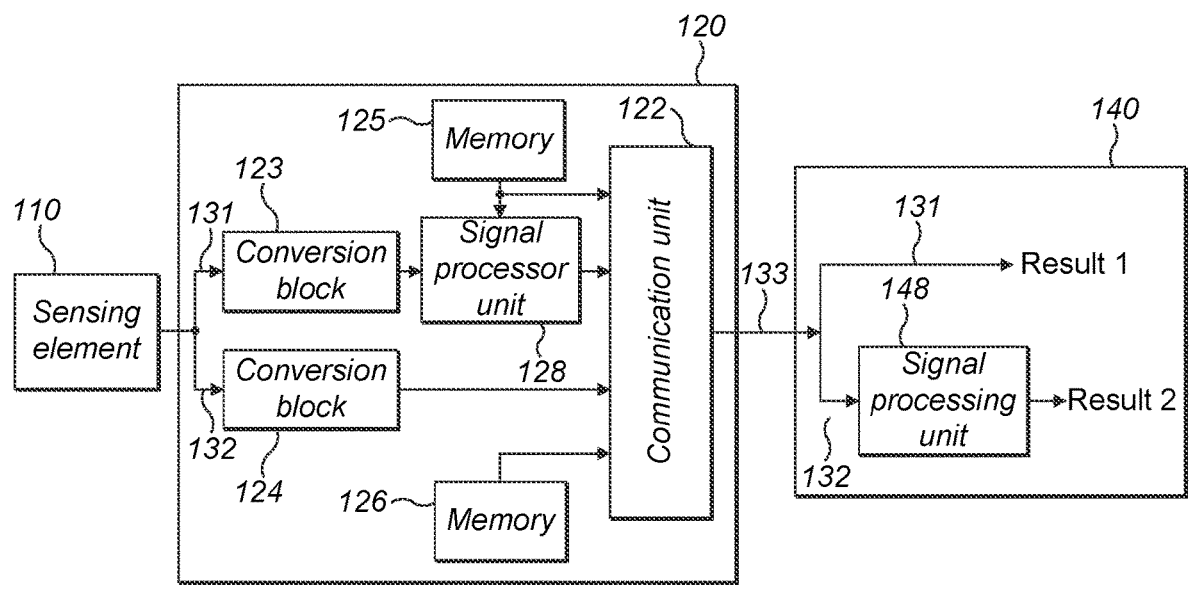
FIG. 2 illustrates another embodiment of the sensor interface circuit.

In the second signal 132 path the digital signal is directly fed to the communication unit 122. The sensor characterisation data (e.g. the calibration coefficients) are available in the memory 125, which is, as already said, operably connected to the communication unit. In an alternative embodiment a separate memory for the second signal path is provided, which is obviously also operably connected to the communication unit 122. This is shown in FIG. 2. The communication unit is used for transmitting the digital signal and the stored sensor characterisation data to the ECU 140 using the communication bus 133.

Preferably the sensor characterisation data is transferred only when the coefficients in the memory need an update. One option to transfer the sensor characterisation data to the ECU is by means of a popular protocol like SENT. This protocol typically works with a slow and a fast message, whereby the necessary memory data is sent to the ECU in several slow channel messages. For example, signal Result 1 and the raw sensor signal in the second signal path are sent each frame and 18 frames are needed to build a slow message. So, it takes about 1 ms to transfer one fast message and 18 ms to transfer one slow message. The sensor characterisation data may be sent in the first slow channel messages exchanged between the sensor interface circuit and the ECU. If the ECU detects this sensor characterisation data is new, it waits until all new data (e.g. calibration coefficients) has been received. If the characterisation data is found to be already stored in the ECU, the ECU can immediately start and calculate the signal Result2 for the second path 132 using the DSP block 148 in the ECU.

In certain embodiments also temperature information is transmitted e.g. using such a slow channel. For a resistive pressure sensor, the temperature information is often derived from the total resistance of a bridge of resistors (which is not changing much with pressure, because typically two resistors increase with pressure, while the other two decrease which pressure). In other cases, a temperature sensor is provided on the interface circuit itself (e.g. bandgap based). It represents very well the pressure sensor temperature when the pressure sensor is part of the interface die or when both dies are in the same package.

In the embodiment shown in FIG. 1 there is a single conversion means. In other embodiments the sensor provides two separate signals which are applied to separate conversion blocks (123,124) provided for a first and a second signal path. This is illustrated in FIG. 2.

Figure 3:
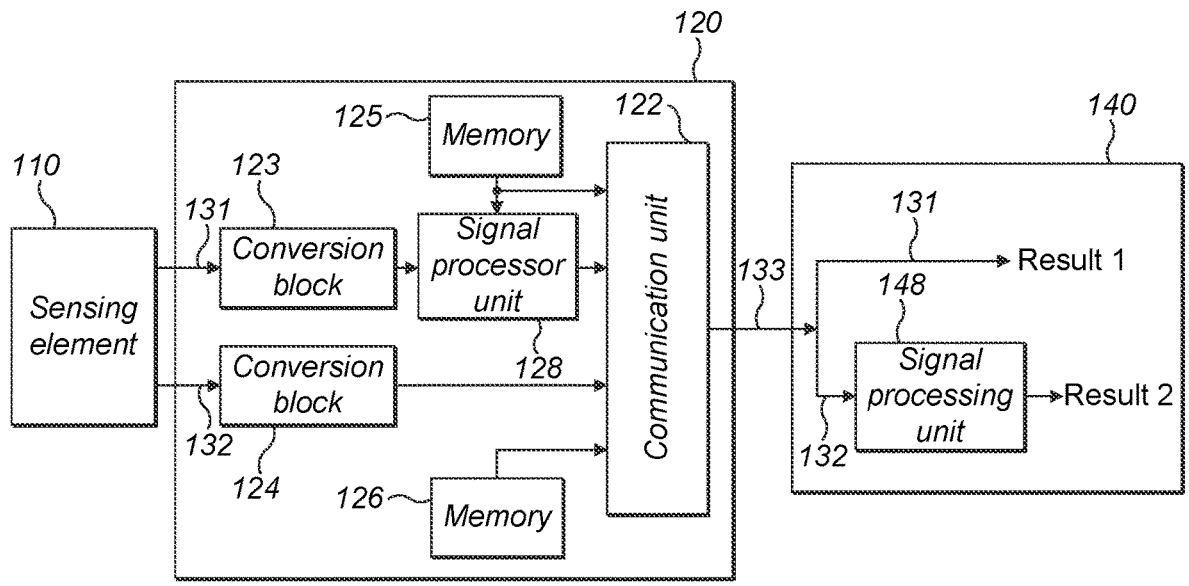
FIG. 3 illustrates yet another embodiment of the sensor interface circuit.

Whereas in FIG. 2 the two conversion blocks receive the same input signal, the sensing element 110 in the embodiment of FIG. 3 outputs two separate signals to two distinct conversion blocks.

Figure 4:
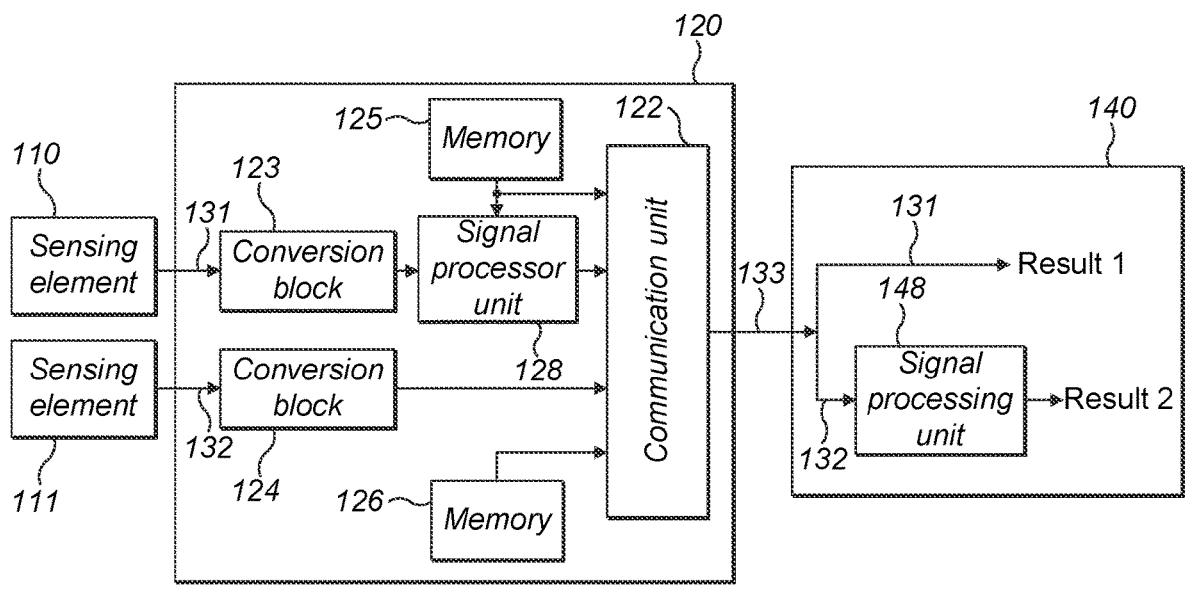
FIG. 4 illustrates yet another embodiment of the sensor interface circuit.

FIG. 4 shows a variant of FIG. 3, whereby two different sensing elements (110,111) are used, each feeding one of the signal paths. Having two distinct sensors may be beneficial because otherwise a single error in the sensor can make both signal results corrupt. One option is to use twice the same sensor, but this is expensive and might not be good enough because of common cause failures. To reduce cost the membrane can be common for both sensors, but different resistors are used. This assumes a very reliable membrane. One of the sensors can use a full bridge, while the other is using only a half bridge. One can also differentiate in the type of resistor used. One can have a resistive and a capacitive sensor to have true diversity. For a MEMS pressure sensor, the size of the membrane (and so the sensitivity) and the shape (square versus round) can be varied.

A key feature of the present invention is the storage of the sensor characterisation data in the memory 125 (and optionally memory 126) of the sensor interface circuit and performing the calculation of the second signal result in the ECU after the characterisation data is transferred from the sensor interface to ECU. Note that in case the memory 126 is present, the connection of the other memory 125 to the communication unit 122 is not strictly needed, as memory 126 is then used for transferring the sensor characterisation data.

The main advantage of storing the coefficients for the ECU calculations in the sensor interface is that the calibration of the sensor and sensor interface circuit can be done without ECU. So, it can be done by the provider of the sensor and sensor interface. Furthermore, it makes it possible to replace the ECU or to replace the sensor and sensor interface without any need to change the rest of the system.

Figure 5:
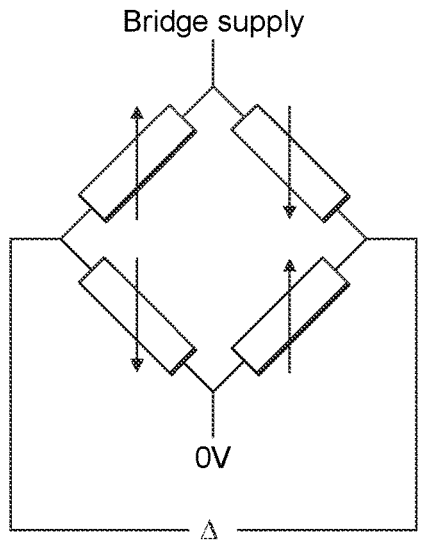
FIG. 5 illustrates an example of a sensor element used with the sensor interface circuit of this invention.

FIG. 5 gives one possible example of a sense element. The sense element here is a full bridge. Other solutions exist with half bridge, readout of a single resistance and more. The readout changes depending on the physical property applied. In this example the resistance of this full bridge changes. However, this behaviour is temperature dependent and far from linear. Most important property is that the readout signal changes a lot from sense element to sense element. Each sense element has its own coefficients to link physical property with the changes of the sense element. Hence, each sense element (see the bridge of FIG. 5) has its calibration coefficients. The delta of two different bridge elements may be different for the same physical change.

This example shows a second order for the relation between bridge value, temperature and physical property. Other models, such as higher order models, inverse relations are also known. Most important is the fact that the relation between the sense element readout and the physical property contains a very generic equation (in this example, the second order) and sense element specific parameters. The sensor characterisation data comprises in this particular example the coefficients $A_i$, $B_i$, $C_i$, $T_0$ and $\Delta_0$. In other examples one can also send raw measurement data, e.g. the digitized data measured during calibration at two different pressures and two different temperatures (hence, four different results), together with the used pressure (e.g. in bar) and used temperature (e.g. in degrees Celsius) for these measurements. During operation the ECU also needs to receive the current digitized pressure data and the temperature information. Then the ECU can perform interpolation to derive the actual pressure (e.g. in bar).

These coefficients (i.e. characterising data) are typically determined by the sensor manufacturer during a so called end of line calibration flow. Here, the sensor is put in a number of application conditions to determine the sensor specific coefficients. To ensure the link between coefficients and sense element is maintained, they then are persistently stored on the sensor interface.

In some embodiments the signal from sensor interface to ECU can be time multiplexed. The signal then comprises in distinct time slots the calculated "Result 1", the raw signal from signal path 2 and the calibration coefficients 2. The ECU is aware of the model or calculation equation. As said, the sensor specific calibration coefficients are stored in the sensor.

Figure 6:
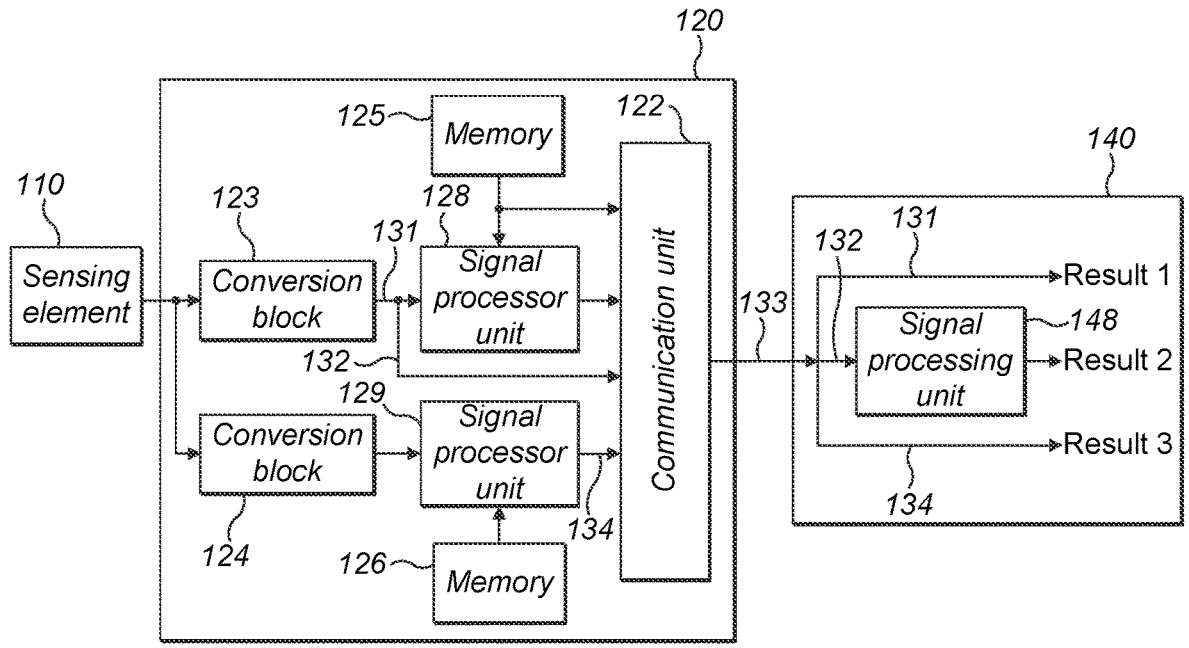
FIG. 6 illustrates an embodiment with three signal paths.

In yet further embodiments of the sensor interface circuit of the present invention there is at least a third signal path 134 which in this example is also calculated in the sensor interface chip circuit. FIG. 6 provides an illustration. If two of the results are very similar, but the third is different, the latter signal cannot be trusted. It may however not always be that easy. In this example converter 123 is common for signal paths 131 and 132. If there is a fault in converter 123, both signal results 131 and 132 are wrong in a similar way, while only the third signal result 134 is correct. For this example, extra safety mechanisms around converter 123 are preferably added. E.g. one can also check the digital output of this converter when some known reference input signals are provided.

When only two signal paths are used, the confidence in both paths may be still different, e.g. because of a different accuracy. This means that if a difference is observed between both signals, the most accurate signal is probably more reliable than the other signal. The difference in accuracy can for example be due to converter 124 being optimized for cost/area, whereas converter 123 is optimized for accuracy.

Another alternative for two signal paths is trying to find out which one is most reliable. E.g. the ECU can trigger (in case communication bus 133 is bidirectional) some self-test features in the sensor interface circuit.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A system comprising
a sensor interface circuit comprising:
an input arranged to receive a sensor signal being an electrical signal representative of an electrical quantity, said electrical quantity being a physical quantity converted in a sensor,
conversion means arranged for converting said sensor signal into a digital signal,
memory to store sensor characterisation data,
signal processing means adapted to obtain a first sensor result by processing said digital signal using said sensor characterisation data,
an output unit arranged to receive and output said first sensor result, said digital signal and said sensor characterisation data,
and a control unit external to said sensor interface circuit, said external control unit arranged to receive said first sensor result, said digital signal and said sensor characterisation data, and comprising further signal processing means adapted to obtain a second sensor result by processing said received digital signal using said received sensor characterisation data and to compare said second sensor result with said received first sensor result.

2. The system as in claim 1, wherein said output unit of said sensor interface circuit is configured to connect to a communication bus.

3. The system as in claim 2, wherein said output unit of said sensor interface circuit is configured to connect to a bidirectional communication bus.

4. The system as in claim 1, wherein said output unit of said sensor interface circuit is arranged for time multiplexing said first sensor result, said digitized version of said sensor signal and said sensor characterisation data.

5. The system as in claim 1, wherein said conversion means comprises a filter and/or an amplifier.

6. The system as in claim 1, comprising separate conversion means for a first signal path comprising said signal processing means and for a second signal path guiding said digital signal to said output unit.

7. The system as in claim 6, wherein said input is arranged to receive two sensor signals from said sensor, each sensor signal being applied to a different one of said separate conversion means.

8. The system as in claim 1, wherein said input is arranged to receive an additional sensor signal from an additional sensor.

9. The system as in claim 1, wherein said sensor interface circuit comprises a further memory to store separately said sensor characterisation data to be output by said output unit.

10. The system as in claim 1, comprising a sensor arranged to convert said physical quantity into said electrical quantity and to output said sensor signal.

11. The system as in claim 1, arranged to derive temperature information and to output said temperature information.

12. A method for verifying signals derived from a sensor signal received in a sensor interface circuit of a system as in claim 1, the method comprising:
receiving said sensor signal in said sensor interface circuit,
determining a first sensor result in said signal processing means of said sensor interface circuit by processing said digital signal using said sensor characterisation data,
outputting from said sensor interface circuit said first sensor result, said digital signal and said sensor characterisation data to an external control unit of said system,
determining in said external control unit a second sensor result by processing said digital signal using said sensor characterisation data in a signal processing means of said external control unit,
comparing said first and said second sensor result.

13. The method for verifying signals as in claim 12, further comprising a step of determining which of said first and second sensor result is most trustworthy by exploiting at least one additional signal path.

14. The method for verifying signals as in claim 12, wherein said external control unit sends a request to receive said sensor characterisation data to said sensor interface circuit.

* * * * *